United States Patent
Alessi et al.

(10) Patent No.: US 12,060,265 B2
(45) Date of Patent: Aug. 13, 2024

(54) SYSTEM AND METHOD FOR DIAGNOSING THE OPERATING STATE OF A MICROELECTROMECHANICAL SENSOR

(71) Applicant: STMICROELECTRONICS S.r.l., Agrate Brianza (IT)

(72) Inventors: Enrico Rosario Alessi, Catania (IT); Fabio Passaniti, Syracuse (IT); Daniele Prati, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 297 days.

(21) Appl. No.: 16/917,202

(22) Filed: Jun. 30, 2020

(65) Prior Publication Data
US 2021/0002126 A1  Jan. 7, 2021

(30) Foreign Application Priority Data

Jul. 2, 2019 (IT) .................. 102019000010698

(51) Int. Cl.
*B81B 7/00* (2006.01)
*G01P 21/00* (2006.01)

(52) U.S. Cl.
CPC .............. *B81B 7/008* (2013.01); *G01P 21/00* (2013.01); *B81B 2201/0257* (2013.01)

(58) Field of Classification Search
CPC .............. B81B 7/008; B81B 2201/025; G01P 21/00; G01C 19/5776; G01C 25/00; G01D 3/08
See application file for complete search history.

(56) References Cited

U.S. PATENT DOCUMENTS

| 3,295,355 | A  |   | 1/1967 | Fisher et al. |
| 4,284,856 | A  | * | 8/1981 | Hochmair ............... A61N 1/372 607/57 |
| 7,543,473 | B2 |   | 6/2009 | Samuels |
| 10,288,447 | B2 | * | 5/2019 | Garre ................. G01C 25/005 |

(Continued)

FOREIGN PATENT DOCUMENTS

| CN | 109188026 A | 1/2019 |
| DE | 10 2006 007 099 A1 | 7/2007 |

(Continued)

OTHER PUBLICATIONS

Machine translation of KR101684653B1 (Year: 2016).*
Allen et al., "Self-Testable Accelerometer Systems," IEEE Micro Electro Mechanical Systems, Proceedings, 'An Investigation of Micro Structures, Sensors, Actuators, Machines and Robots', Salt Lake City, UT, USA, 1989, pp. 113-115.

(Continued)

*Primary Examiner* — Lee E Rodak
*Assistant Examiner* — Sangkyung Lee
(74) *Attorney, Agent, or Firm* — Seed IP Law Group LLP

(57) ABSTRACT

A system for diagnosing the operating state of a MEMS sensor includes a stimulation circuit, external to the MEMS sensor, configured to generate a stimulation signal designed to be detected by the MEMS sensor. The system has control circuitry, operatively coupled to the stimulation circuit and to the MEMS sensor, so as to control the stimulation circuit to generate the stimulation signal and receive a diagnostic signal generated by the MEMS sensor in response to the stimulation signal. The control circuitry determines an operating state of the MEMS sensor based on the diagnostic signal and an expected response to the stimulation signal by the MEMS sensor.

19 Claims, 4 Drawing Sheets

(56) References Cited

U.S. PATENT DOCUMENTS

| | | | |
|---|---|---|---|
| 2008/0081958 A1* | 4/2008 | Denison | A61N 1/3706 |
| | | | 600/300 |
| 2010/0145660 A1 | 6/2010 | Lang et al. | |
| 2013/0133422 A1* | 5/2013 | Yamanaka | G01P 21/00 |
| | | | 73/504.03 |
| 2013/0265070 A1 | 10/2013 | Kleks et al. | |
| 2013/0340524 A1* | 12/2013 | Maeda | G01P 15/125 |
| | | | 73/514.02 |
| 2015/0276540 A1 | 10/2015 | Huseynov et al. | |
| 2017/0168088 A1 | 6/2017 | Coronato et al. | |
| 2018/0233026 A1* | 8/2018 | Litovtchenko | G08B 29/04 |
| 2019/0076044 A1* | 3/2019 | Krubsack | A61B 5/7275 |
| 2019/0129409 A1* | 5/2019 | Cella | G05B 13/028 |
| 2021/0003524 A1 | 1/2021 | Passaniti et al. | |
| 2021/0253419 A1 | 8/2021 | Alessi et al. | |

FOREIGN PATENT DOCUMENTS

| | | | |
|---|---|---|---|
| KR | 101684653 B1 * | 12/2016 | |
| WO | 2016/113653 A1 | 7/2016 | |
| WO | WO 2019011909 A1 | 1/2019 | |

OTHER PUBLICATIONS

Charlot et al., "Electrically Induced Stimuli for MEMS self-test," Proceedings 19th IEEE VLSI Test Symposium, Marina Del Rey, CA, USA, 2001, pp. 1-6.

Reyntjens et al., "RASTA: the Real-Acceleration-for-Self-Test Accelerometer," Transducers '01, Eurosensors XV, The 11th International Conference on Solid-State Sensors and Actuators, Munich, Germany, Jun. 10-14, 2001, pp. 434-437.

* cited by examiner

JTFAx

JTFAy

JTFAz

SYSTEM AND METHOD FOR DIAGNOSING THE OPERATING STATE OF A MICROELECTROMECHANICAL SENSOR

BACKGROUND

Technical Field

The present disclosure relates to a system and a method for diagnosing the operating state of a microelectromechanical movement sensor, made with MEMS (Micro-Electro-Mechanical System) semiconductor technology.

Description of the Related Art

As is known, MEMS sensors, movement (or inertial) sensors, are today extensively used in a wide range of applications, not only in portable electronic devices (such as smartphones, tablets, or the like), but also for industrial applications, for example for monitoring moving parts and/or parts subject to vibrations.

For example, there are several so-called "critical" applications, e.g., ones involving risks associated to safety of persons or systems, wherein MEMS movement sensors are used. By way of example, systems in the automotive or aerospace fields and systems for controlling proper operation and integrity of parts of machinery for industrial processes may be cited.

In this kind of applications, robust testing and diagnostic systems are employed that allow monitoring of proper operation of MEMS sensors in order to prevent false detections (so called "false positives" or "false negatives"), which are due, for example, to degradation or damage of the MEMS sensors or to their wear over time.

Diagnostic systems of a known type envisage integrated (so-called "built-in") test mechanisms, provided within the same MEMS sensors.

In a known way, MEMS sensors, the aforesaid movement sensors (or inertial sensors), such as accelerometers, gyroscopes, or the like, in general comprise: a micromechanical structure made in a die of semiconductor material and including moving parts (which move by the inertial effect or as a result of a corresponding actuation, for example of an electrostatic or electromagnetic type); and moreover an electronic circuit, the so-called ASIC (Application-Specific Integrated Circuit), made in a respective die of semiconductor material and operatively coupled to the microelectromechanical structure for receiving electrical detection signals (for example, acceleration or angular-velocity signals) and supplying electrical actuation and/or driving signals.

For instance, a MEMS accelerometer typically comprises an inertial mass, suspended above a substrate by means of elastic suspension elements, mobile detection electrodes associated with the inertial mass, and fixed detection electrodes, which are fixed with respect to the substrate and are coupled, for example capacitively, to the mobile electrodes. Due to displacement of the inertial mass (as a result of an acceleration acting on the MEMS sensor), a relative displacement of the mobile electrodes with respect to the fixed electrodes is generated and, as a result, a capacitive variation, which in turn generates an electrical detection signal, which is a function of the acceleration that is to be detected (along one or more axes of detection).

An integrated test structure may, in this case, envisage the presence of further testing electrodes and dedicated electrical contact pads for supplying appropriate excitation signals (which constitute a testing stimulus), these contact pads being provided in the same micromechanical structure as that of the MEMS sensor, in order to generate a test movement of the inertial mass (thus simulating the presence of an external acceleration to be detected) and enable verification of proper operation of the sensing structure. In a corresponding manner, an electronic testing stage is incorporated in the ASIC, for control and execution of the test procedure.

If a significant variation (for example, in the frequency content, determined via spectral analysis) is detected between the detection signal in the testing condition (upon application of the test stimulus) and in a condition of absence of the test stimulus, proper operation of the MEMS sensor may be inferred; otherwise, a condition of failure or malfunctioning of the same MEMS sensor may be determined.

BRIEF SUMMARY

An embodiment provides an improved method for diagnosing, even in real time and during operating conditions of the associated mechanical or electronic system, the operating state of a MEMS sensor, in some embodiments in order to check for the presence of possible failures, faults, or malfunctioning.

According to the present disclosure, a diagnostic system and method are thus provided.

In some aspects, a diagnostic system includes stimulation circuitry configured to generate a stimulation signal to be detected by a MEMS sensor external to the stimulation device; and control circuitry, operatively coupled to the stimulation circuitry and to the MEMS sensor, configured to control the stimulation circuitry to generate the stimulation signal, to receive a diagnostic signal generated by the MEMS sensor in response to the stimulation signal, and to determine an operating state of the MEMS sensor based on the diagnostic signal and an expected response to the stimulation signal by the MEMS sensor.

In some aspects, a method includes generating, externally to a MEMS sensor, a stimulation signal to be detected by the MEMS sensor; receiving a diagnostic signal generated by the MEMS sensor in response to the stimulation signal; and determining an operating state of the MEMS sensor based on the diagnostic signal and an expected response to the stimulation signal.

In some aspects, a system includes a micro-electro-mechanical-system sensor; stimulation circuitry operable to generate a first signal to be detected by the micro-electromechanical-system sensor; and a control unit operable to control the stimulation circuitry for the generating the first signal, to receive a second signal from the micro-electromechanical-system sensor in response to the first signal, and to determine an operating state of the micro-electro-mechanical-system sensor by analysing the second signal.

BRIEF DESCRIPTION OF THE SEVERAL VIEWS OF THE DRAWINGS

For a better understanding of the present disclosure, various embodiments thereof are now described, purely by way of non-limiting example, with reference to the attached drawings, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

Throughout the figures annexed herein, like parts or elements are indicated with like references/numerals and a corresponding description will not be repeated for brevity.

The references used herein are provided merely for convenience and hence do not define the extent of protection or the scope of the embodiments.

Figure 1:
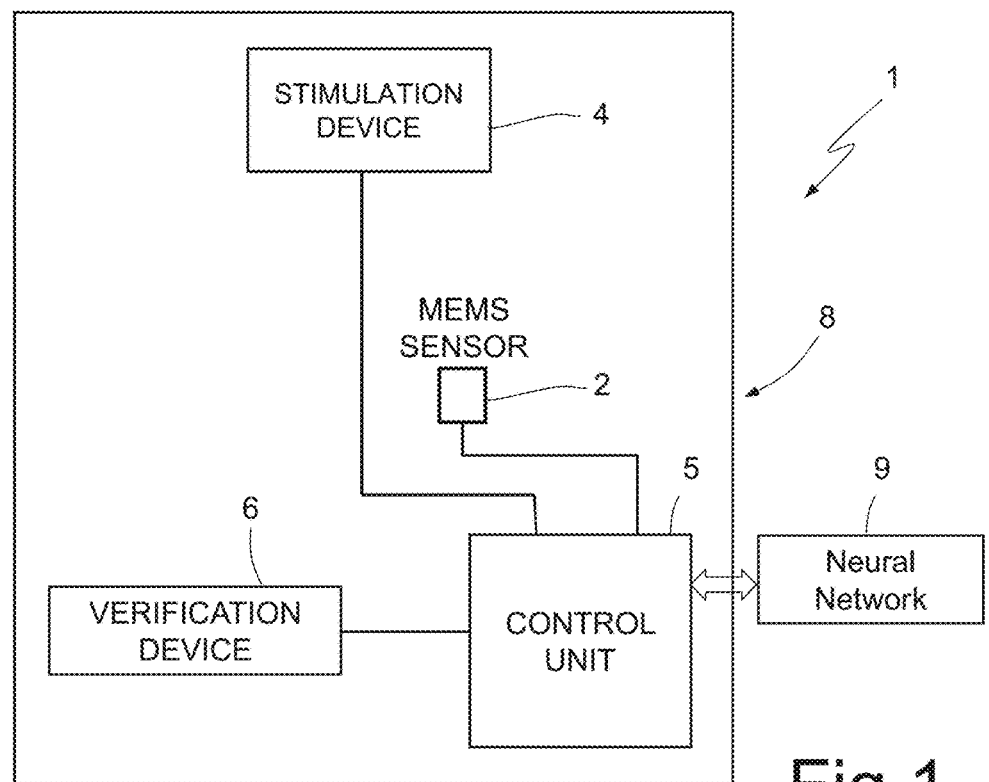
FIG. 1 shows a general block diagram of a system for diagnosing a MEMS sensor, according to an embodiment of the present disclosure.

With reference to FIG. 1, a diagnostic system 1 is now disclosed, designed to monitor the operating state of a MEMS sensor, for example, a movement or inertial sensor, such as an accelerometer, which has, for example, functions of controlling the operating conditions of an associated mechanical or electronic system (not illustrated herein for simplicity), for example by analysing the vibrations associated to the same system.

The diagnostic system 1, in the embodiment illustrated, comprises, in addition to the MEMS sensor 2, of which the state of proper operation is to be diagnosed and which therefore represents the so-called DUT (Device Under Test), a stimulation device 4, external to the MEMS sensor 2, which is designed to generate a stimulus such as to evoke a response and generation of a corresponding signal, referred to herein as diagnostic signal, by the same MEMS sensor 2.

The stimulation device or circuit 4 may, for example, be a generator of vibrations, such as an electric motor, a speaker, or any other vibrating element, for example, a piezoelectric actuator, and is configured to generate a stimulation signal $S_t$, having characteristics, for example, in terms of a corresponding frequency bandwidth and of appropriate amplitudes, such as to be detected by the MEMS sensor 2, for generation of a corresponding diagnostic signal $S_d$.

Advantageously, the stimulation signal $S_t$ may be a so-called multi-tone signal, e.g., a signal constituted by a plurality of frequencies comprised in the band detectable by the MEMS sensor 2, or else may be constituted by an appropriate sequence of tones, or again by an increasing or decreasing frequency ramp so as to sweep sequentially an entire frequency band of interest.

The diagnostic system 1 comprises a control unit or circuit 5, which includes a microcontroller, a control logic or other suitable or similar processing element provided with a non-volatile memory, in which processing instructions are stored, and is electrically coupled to the MEMS sensor 2 and to the aforesaid stimulation device 4. In some embodiments, the control unit 5 controls the stimulation device 4 for the generation of the stimulation signal $S_t$, receives the corresponding diagnostic signal $S_d$ generated by the MEMS sensor 2 in response to the stimulation signal $S_t$, and processes the diagnostic signal $S_d$ in order to verify the state of the operation of the MEMS sensor 2.

According to an aspect of the present disclosure, the diagnostic system 1 further comprises a verification device or circuit 6, distinct from and external with respect to the MEMS sensor 2, which is designed to receive the same stimulation signal $S_t$ generated by the stimulation device 4 and generate, in response to this stimulation signal $S_t$, a verification signal $S_v$. The verification device 6 is, for example, a microphone sensor or any other sensor capable of detecting the aforesaid stimulation signal $S_t$.

The control unit 5 is, in this case, electrically coupled to the verification device 6 in order to receive the verification signal $S_v$ and to carry out a preliminary verification, as will be discussed in detail hereinafter, of proper generation of the stimulation signal $S_t$ by the stimulation device 4 and therefore of the reliability of diagnosis of the operating state of the MEMS sensor 2.

In some embodiments, the aforesaid stimulation device 4, the control unit 5, the verification device 6, and, moreover, the MEMS sensor 2 are coupled to a same electronic board 8, such as a printed-circuit board (PCB), which defines the mutual electrical connections thereof (by appropriate electrical-connection paths) and which moreover defines corresponding elements for electrical connection towards the outside (for example, in the form of electrical contact pads).

In some embodiments, the diagnostic system 1 includes a neural network 9. The neural network 9 may be part of the control unit 5 or may be communicatively coupled to the control unit 5.

Figure 2:
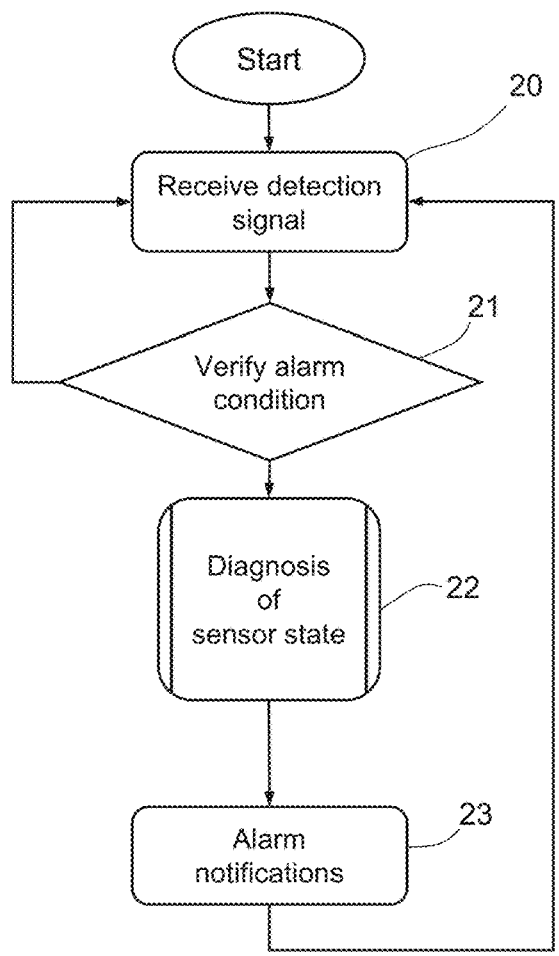
FIGS. 2-4 show flowcharts of diagnostic operations performed by the system of FIG. 1.

With reference to the flowchart of FIG. 2, an embodiment of the diagnostic procedure implemented by the diagnostic system 1 envisages, in an initial step, as represented by block 20, receiving, by the control unit 5, a detection signal $S_r$ generated by the MEMS sensor 2 during a normal operating condition.

The MEMS sensor 2, which, for example, is a triaxial accelerometer, can be operatively associated with a mechanical system, such as an industrial machinery (here not illustrated), and the aforesaid detection signal $S_r$ may, for example, be indicative of vibrations associated with the aforesaid mechanical system.

As represented by block 21, the control unit 5 is configured to process the detection signal $S_r$ in order to verify the existence of an alarm condition. For instance, the control unit 5 can perform a spectral analysis and, in the case of identification of anomalous spectral components indicative, for example, of unexpected vibrations, which are a symptom of a potential problem or failure of the part being monitored, can identify a potential alarm condition.

According to an aspect of the present disclosure, in response to identification of the potential alarm condition, the control unit 5 is configured, as represented by block 22, to activate a procedure for diagnosing the state of the MEMS sensor 2 in order to confirm, or otherwise reject as not reliable, the alarm condition.

It is emphasised that this diagnostic procedure is carried out without requiring stop of the mechanical or electronic system in which the MEMS sensor 2 is installed; e.g., the diagnostic procedure is carried out during operation (e.g., in runtime mode) and is not affected by the operating conditions of the same mechanical or electronic system, therefore being immune to external conditions.

In general, the diagnostic procedure envisages generation of the stimulation signal $S_t$ by the stimulation device 4 and reception and processing, by the control unit 5, of the diagnostic signal $S_d$ generated by the MEMS sensor 2 in response to the stimulation signal $S_t$. Based on the processing of the diagnostic signal $S_d$, and as a function of an expected response to the stimulation signal $S_t$, e.g., a pre-set response or a response defined at the design stage), the control unit 5 is able to diagnose the operating state of the MEMS sensor 2 and, according to this diagnosis, confirm, or not, the previously detected alarm condition. For example, the diagnostic signal Sd or characteristics thereof may be compared to an expected response to the stimulation signal, such as expected characteristics. Thresholds may be employed.

As represented by block 23, appropriate alarm notifications can then be generated on the basis of the diagnosis of the operating state of the MEMS sensor 2.

Figure 3:
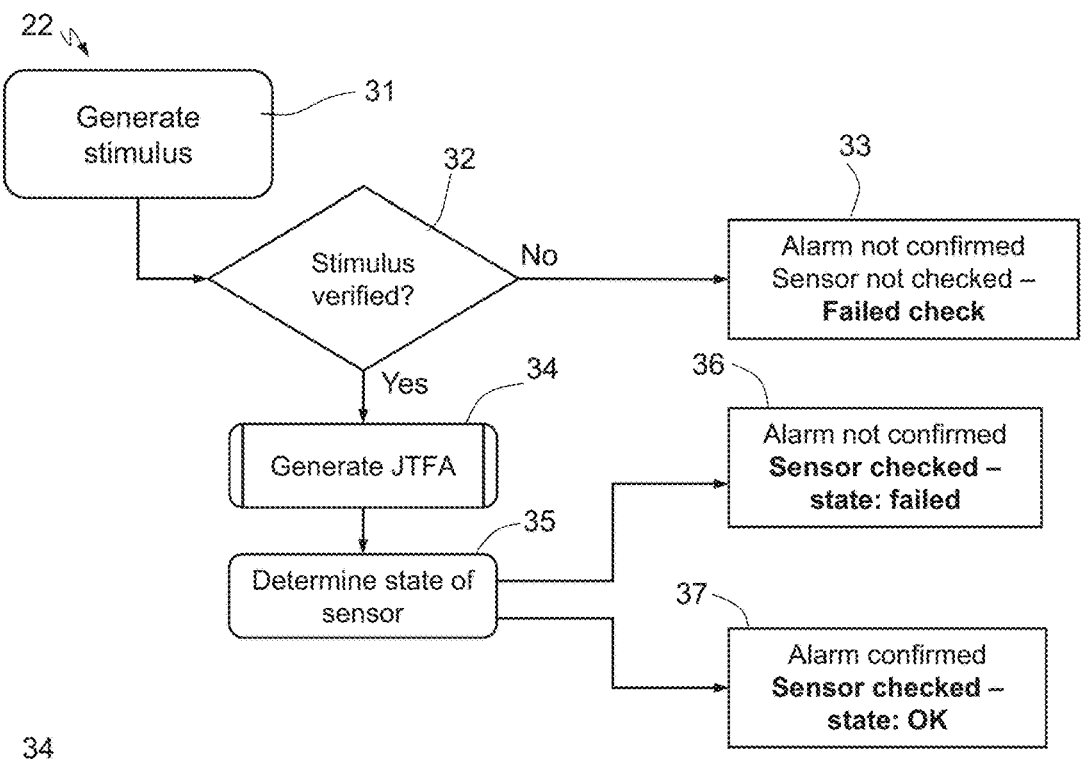

In greater detail, and with reference also to FIG. 3, the diagnostic procedure, e.g., carried out in the aforesaid block 22, of an embodiment envisages, as represented by block 31, generation of the stimulation signal $S_t$ by the stimulation device 4, appropriately controlled by the control unit 5.

The stimulation signal $S_t$ may be a multi-tone, multi-frequency (or variable-frequency, or modulated-frequency) signal, having a frequency range comprised in the frequency band detectable by the MEMS sensor 2 and, if present, in the frequency band of the verification device 6. According to an aspect of the present disclosure, the same stimulation signal $S_t$ has a frequency content that falls, instead, outside the frequency spectrum in which the mechanical or electronic system associated with the MEMS sensor 2 operates, so as to be easier to analyse.

The control unit 5 then processes the verification signal $S_v$, as represented by block 32, to verify whether the stimulation generated by the stimulation device 4 has been received correctly and checked by the verification device 6.

In the case where the aforesaid verification does not have a positive outcome, as represented by block 33, the diagnostic procedure stops, and a datum is returned at the output, for example, to a management unit of the mechanical or electronic system with which the MEMS sensor 2 is associated) that is indicative that the check has failed and therefore that the alarm is not confirmed (due to the impossibility of checking the operating state of the same MEMS sensor 2).

Instead, in case of a positive outcome of the verification on the stimulation generated by the stimulation device 6, the control unit 5 processes the diagnostic signal $S_d$ generated by the MEMS sensor 2 in response to the same stimulation signal $S_t$ to verify whether it is in line with the expected response and therefore check the operating state of the same MEMS sensor 2.

According to an aspect of the present disclosure, the control unit 5 carries out a joint time and frequency analysis of the aforesaid diagnostic signal $S_d$, in some embodiments generating a JTFA (Joint Time-Frequency Analysis) response, as represented by block 34.

As a function of the joint time and frequency response, in some embodiments of the JTFA response, and of the compliance of the characteristics of the diagnostic signal $S_d$ with the expected response, the control unit 5 then determines, as represented by block 35, the state of the MEMS sensor 2 and in some embodiments determines the state of proper operation or the state of fault (or failure) of the same MEMS sensor 2.

As represented by block 36, if the MEMS sensor 2 is found not to be operating correctly, the alarm condition is therefore not confirmed; instead, as represented by block 37, if proper operation of the MEMS sensor 2 is verified, the alarm condition is confirmed (so that appropriate actions can be adopted, for example replacement of the part of the machine or electronic system with which the MEMS sensor 2 is associated that has turned out not to meet the expected performance).

According to an aspect of the present disclosure, the control unit 5 may be further configured to internally implement, or to cause implementation of by an external processing unit (for example, operating "in the cloud"), an appropriate artificial-intelligence algorithm, for the aforesaid verification of the state of proper operation or failure of the MEMS sensor 2.

In some embodiments, the time and frequency response, the JTFA response, is in this case subjected to classification by a neural network 9 (FIG. 1) previously trained, for example a convolutional neural network (CNN), designed to supply at its output the operating state of the MEMS sensor 2 on the basis of a pattern (or evolution) of the same time and frequency response.

In some embodiments, it is emphasised that the aforesaid neural network can be advantageously trained for considering the patterns of the time-frequency response also during operation of the mechanical or electronic system with which the MEMS sensor 2 is associated.

Consequently, according to an aspect of the present disclosure, the aforesaid neural network is able to provide at its output, so that it is available to the control unit 5, also a datum regarding a part (or component) of the aforesaid mechanical or electronic system with which the alarm is associated and which is therefore potentially damaged or has a fault or failure. In fact, the neural network can be trained to recognise in the aforesaid time-frequency response also appropriate patterns associated with respective parts of the machine or electronic system, thus verifying the conformity thereof with a respective expected response.

Advantageously, the analysis performed by the aforesaid neural network, and therefore by the control unit 5, may moreover be of a predictive and prescriptive type, allowing to identify in advance potential damage or failure of the aforesaid parts of the mechanical or electronic system, in this case issuing appropriate alarm signals (in order to enable targeted actions of repair or replacement).

In the aforesaid block 37, in addition to confirming the alarm condition, the control unit 5 can then supply at the output also an indication of the part involved and indications, also of a predictive type, for preventive maintenance or replacement of the part of the mechanical or electronic system associated with the MEMS sensor 2.

Figure 4:
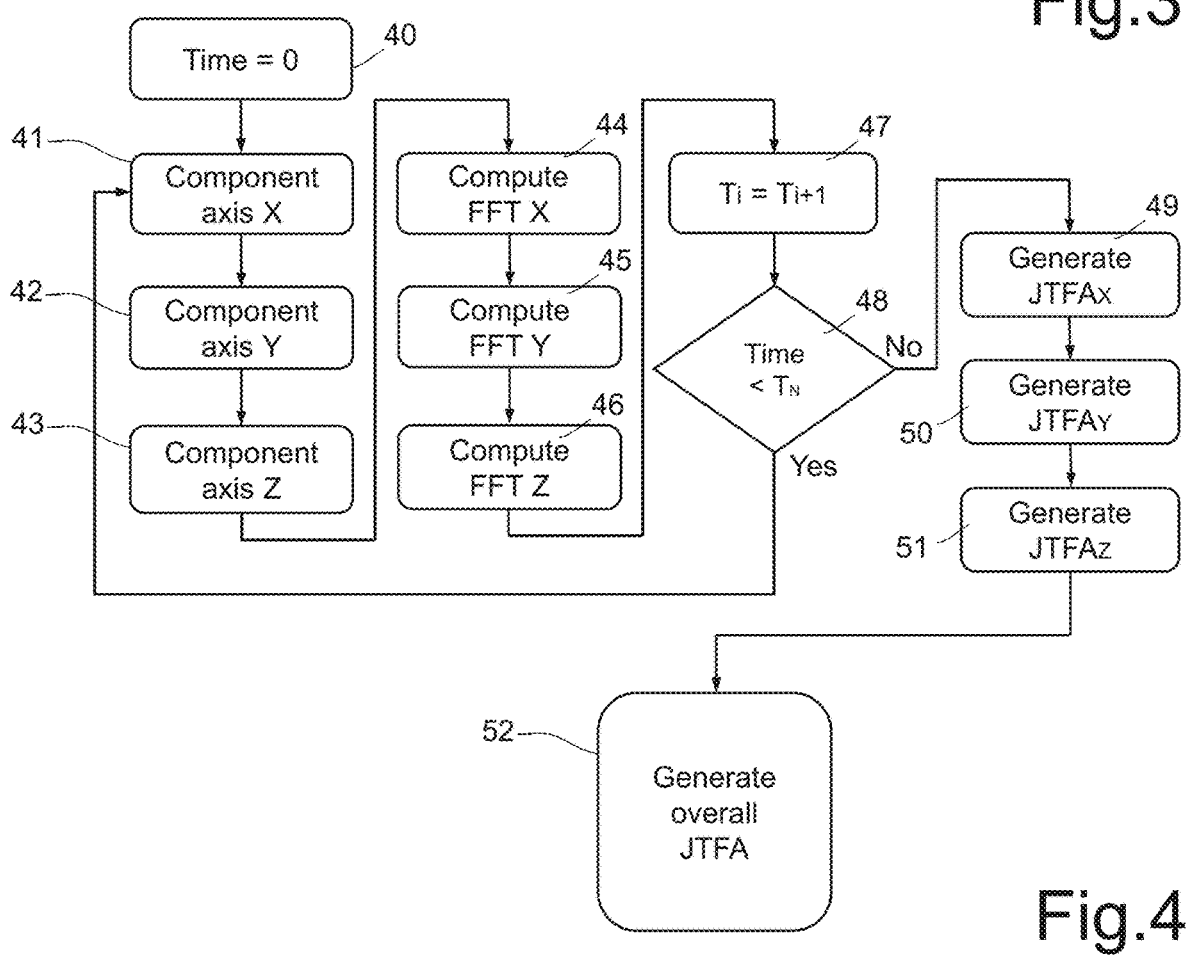

In greater detail, and with reference to FIG. 4, the joint time and frequency analysis of the diagnostic signal $S_d$ carried out by the control unit 5 (in the aforesaid block 34), in some embodiments of the JTFA analysis, envisages, first, at an initial time instant (time 0), as represented by block 40, and subsequently at a generic time instant $T_i$, acquisition of the diagnostic signal $S_d$, and in some embodiments: acquisition of a component along the X axis (block 41); acquisition of a component along the Y axis (block 42); and acquisition of a component along the Z axis (block 43) (the aforesaid X, Y, and Z axes defining a three-dimensional cartesian reference system associated with the MEMS sensor 2).

The analysis then envisages determining the frequency response at time $T_i$, and in some embodiments: calculation of the FFT (Fast Fourier Transform) response along the X axis, as represented by block 44; calculation of the FFT response along the Y axis, as represented by block 45; and calculation of the FFT response along the Z axis, as represented by block 46.

As represented by block 47 (which applies a time increment to determine the next instant $T_{i+1}$) and by block 48 (which indicates the comparison of the current instant with the length of a given reference time interval $T_N$, for example corresponding to a time window of 10 s), the aforesaid operations are repeated until the end of the aforesaid reference time interval $T_N$ is reached. At this point (in a per se known manner, here not described in detail) the time-frequency responses for the aforesaid X, Y, and Z axes are generated, namely: the time-frequency response along the X axis, for example the uniaxial JTFA response, designated by $JTFA_X$ (block 49); the time-frequency response along the Y axis, for example once again the uniaxial JTFA response, designated by $JTFA_Y$ (block 50); and the time-frequency response along the Z axis, for example once again the uniaxial JTFA response, designated by $JTFA_Z$ (block 51).

As represented by block 52, the aforesaid uniaxial time-frequency responses, for example the aforesaid $JTFA_X$, $JTFA_Y$, and $JTFA_Z$ responses, are appropriately combined (once again in a per se known manner and here not described in detail) for generation of the overall time and frequency response, for example, the JTFA response, for the subsequent analyses, performed by the control unit 5, of the operating state of the MEMS sensor 2 (and the possible further analyses regarding diagnosis of operation of parts of the mechanical or electronic system associated with the MEMS sensor 2).

Figure 5A:
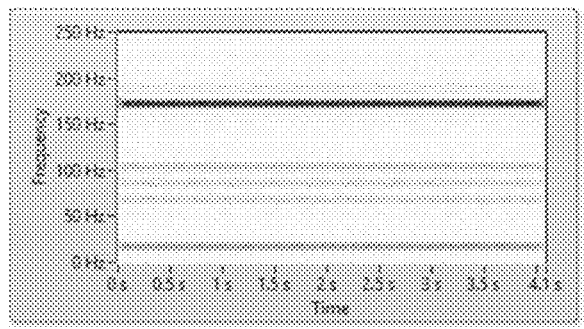
FIGS. 5A-5C and 6A-6C show example plots of quantities associated with the aforesaid diagnostic operations, respectively in the case of a properly functioning MEMS sensor and of a MEMS sensor not properly functioning.
Figure 5B:
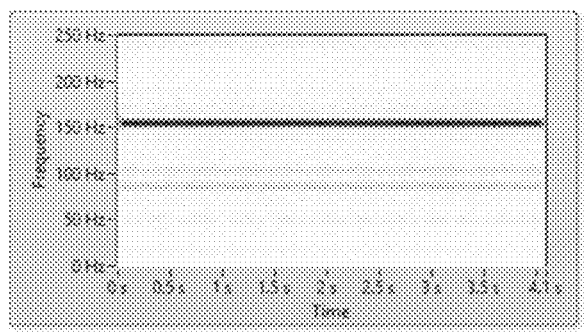
Figure 5C:
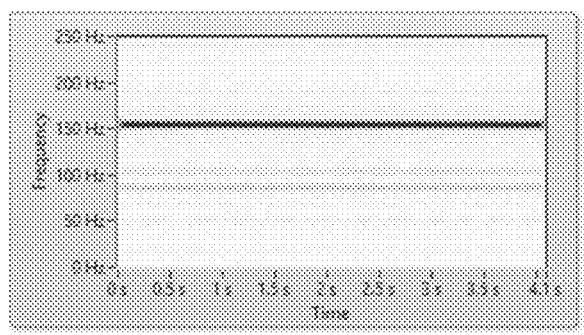
Figure 6A:
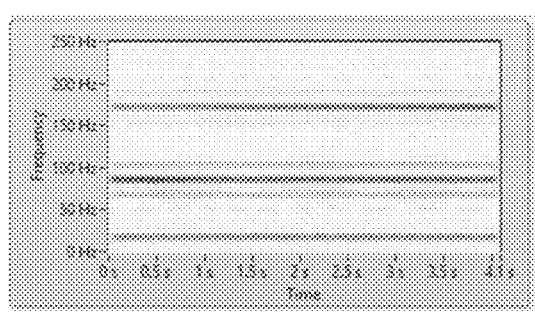
Figure 6B:
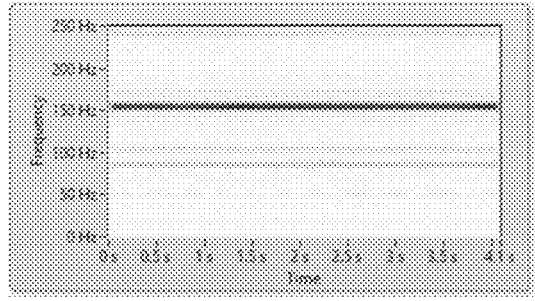
Figure 6C:
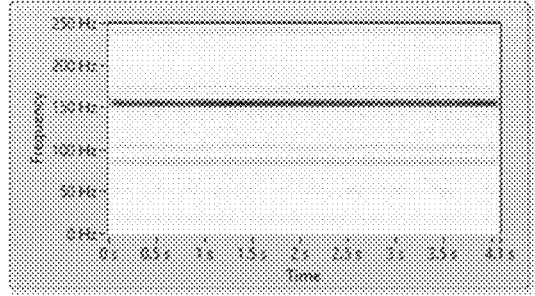

Regarding what has been discussed previously, FIGS. 5A, 5B, and 5C show diagrams provided by way of example representing, respectively, the aforesaid uniaxial responses $JTFA_X$, $JTFA_Y$, and $JTFA_Z$ for the joint time-frequency analysis, in the case of a state of proper operation of the MEMS sensor 2 (e.g., of an operation of the MEMS sensor 2 in line with the expected response to the stimulation, as highlighted by the presence of just the frequencies of the stimulation signal $S_t$ throughout the time interval considered); FIGS. 6A, 6B and 6C show, instead, diagrams provided by way of example representing the same uniaxial responses $JTFA_X$, $JTFA_Y$, and $JTFA_Z$, in the case of a state of failure of the MEMS sensor 2 (e.g., of an operation of the MEMS sensor 2 not in line with the expected response to the stimulation, as highlighted by the variation of the spectrogram $JTFA_X$ with respect to the one obtained in nominal conditions of the system, in some embodiments owing to the absence, or attenuation, of harmonics corresponding to the aforesaid stimulation signal $S_t$).

Figure 7:
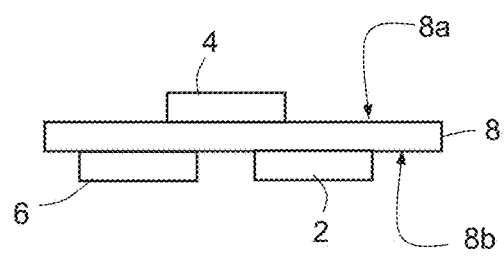
FIG. 7 is a schematic illustration of a possible implementation of an electronic circuit board of the diagnostic system.

By way of example, FIG. 7 is a schematic illustration of a possible implementation of the aforesaid electronic board 8, and in some embodiments a corresponding arrangement of the stimulation device 4, of the verification device 6, and of the MEMS sensor 2.

In this possible embodiment, the aforesaid stimulation device 4 is mounted (with known techniques, here not discussed in detail) in contact with a first surface, for example a front surface 8a, of the aforesaid electronic board 8, whereas the aforesaid verification device 6 and moreover the MEMS sensor 2 are mounted (once again with known techniques) in contact with a second surface, for example a rear surface 8b of the same electronic board 8, vertically opposite (along the Z axis) to the front surface 8a.

It is emphasised, however, that different mutual arrangements of the aforesaid elements of the diagnostic system 1 may be envisaged, which will in any case be such that the stimulation signal $S_t$ generated by the stimulation device 4 can be sensed and detected both by the verification device 6 (to enable, as discussed in detail previously, verification of the correct generation of the same stimulation) and by the MEMS sensor 2 (to enable, once again as discussed in detail previously, verification of the state of the MEMS sensor 2 and consequent confirmation, or otherwise refusal, of the alarm condition).

The advantages of the present disclosure are clear from the foregoing description.

In any case, it is emphasised that the diagnostic disclosure described enables a reliable determination of the operating state of the MEMS sensor 2 and therefore a confirmation of an alarm condition determined on the basis of the detection signal $S_r$, generated by the same MEMS sensor 2 (therefore preventing cases of "false positives" or "false negatives").

In some embodiments, the aforesaid diagnostic disclosure is simple and inexpensive to implement, not requiring, for example, any additional element in the micromechanical structure or any additional stage in the associated ASIC of the MEMS sensor 2.

It should be noted in this regard that the elements of the diagnostic system 1 may also be already present (possibly having, in this case, also distinct and additional functions) in the system with which the MEMS sensor 2 is associated: for example, the aforesaid stimulation device 4 could comprise a speaker or a vibration device already present, in a known way, in the same system (considering, for example, the case of use of the MEMS sensor 2 in a smartphone or similar portable device); likewise, the aforesaid verification device 6 could comprise a microphone already present, in a known way, in the same system; finally, the aforesaid control unit 5 could form part of, or be implemented by, a microprocessor or microcontroller unit having functions of management of the same system.

Advantageously, diagnosis of the operating state of the MEMS sensor 2 may moreover be carried out in real time and in a way independent of the external conditions.

The use of artificial intelligence, for example of a convolutional neural network, enables refinement over time of the process of classification of the operating state of the MEMS sensor 2, responding, for example, to potential effects of ageing or modifications of some other nature of the same MEMS sensor 2 and/or of the system with which it is associated (which could render less reliable a verification of the operating state based upon just the expected, predefined, response).

Finally, it is clear that modifications and variations may be made to what has been described and illustrated herein, without thereby departing from the scope of the present disclosure.

In some embodiments, it is once again pointed out that the diagnostic system 1 may envisage different types of stimulation devices 4 for generation of the stimulation signal $S_t$, as likewise different types of verification devices 6 for generation of the verification signal $S_v$, provided that the compatibility between the stimulation device 4 and the verification device 6 is guaranteed (for example, in terms of the respective frequency bands or of further characteristics of the signal) and moreover that the compatibility between the stimulation device 4 and the MEMS sensor 2 is also guaranteed.

Furthermore, it is underlined that the control unit 5 may be configured to activate the procedure for diagnosing the operating state of the MEMS sensor 2 at pre-set times, for example when a given time interval has elapsed starting from a previous diagnostic procedure, instead of in response to identification of a potential alarm condition.

In this case, an alarm condition detected can be confirmed, or otherwise rejected, in a way that, on the other hand, altogether corresponds to what has been discussed previously, according to the outcome of the aforesaid last diagnostic procedure carried out.

In addition, the analysis of the diagnostic signal $S_d$ (and/or of the detection signal $S_r$) carried out by the control unit 5 may envisage a different joint time and frequency processing, for example of a CWT (Continuous-Wavelet Transform) type.

It is once again pointed out that the electronic board 8 to which the various components of the diagnostic system 1 are coupled (e.g., the aforesaid stimulation device 4, control unit 5, and verification device 6), and the same components of the diagnostic system 1, can be dedicated exclusively to the diagnostic procedure or be used also for other functions, other than the same diagnostic procedure.

Embodiments of the present disclosure may provide multiple technical advantages. For example, using the external test structures, space and resources are saved in the microelectromechanical structure and in the associated electrical circuit of the MEMS sensor, with a consequent decrease in costs and manufacturing complexity.

Moreover, during the testing mode, the MEMS sensor does not need to be maintained in a controlled condition, and can therefore be used for sensing operations and for controlling the operating condition of the associated mechanical or electronic system. In this regard, the MEMS sensor can have further used in fields where it is not feasible or prohibited to stop the mechanical or electronic system in order to execute the procedure for testing the operation of the MEMS sensor.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system, comprising:
an industrial machine;
a board on the industrial machine;
a micro-electro-mechanical system (MEMS) sensor coupled to the board, the MEMS sensor configured to output a detection signal in a normal operating condition;
control circuitry coupled to the board and to the MEMS sensor, the control circuitry configured to:
process the detection signal to verify an existence of an alarm condition;
initiate a diagnostic procedure while the MEMS is in the normal operating condition in response to the alarm condition;
a stimulation device coupled to the board and configured to generate vibrations in a plurality of frequencies in response to the diagnostic procedure being initiated, the MEMS sensor being external to the stimulation device, the MEMS sensor configured to sense the vibrations and generate a diagnostic signal in response to the vibrations, the control circuitry configured to receive the diagnostic signal;
a verification sensor coupled to the board and external to the MEMS sensor and the stimulation circuitry, the verification sensor configured to also receive the vibrations and generate a verification signal based on the vibrations, the control circuitry configured to receive the verification signal, the control circuitry configured to:
compare the verification signal to a first reference to determine if the stimulation device has properly generated the vibrations;
if the stimulation device has properly generated the vibrations, determine whether the alarm condition is verified by comparing the diagnostic signal from the MEMS sensor to a reference signal; and
output a state of the MEMS device with a status of the alarm condition;
a management unit coupled to the industrial machine and configured to receive the state of the MEMS device and the status of the alarm condition.

2. The system according to claim 1, wherein the control circuitry is configured to perform a joint time-frequency analysis of the diagnostic signal and to check for a response pattern in the joint time-frequency analysis.

3. The system according to claim 2, wherein the MEMS sensor is a triaxial sensor and the diagnostic signal has components along a first, a second, and a third axes of a reference system; and wherein the joint time-frequency analysis includes uniaxial responses with respect to each of the first, second, and third axes, respectively, and a combination of the uniaxial responses.

4. The system according to claim 2, comprising a neural-network configured to perform automatic classification based on the joint time-frequency analysis in order to determine the operating state of the MEMS sensor.

5. The system according to claim 4, wherein the control circuitry is configured to perform an analysis of a detection signal generated by the MEMS sensor and indicative of one or more characteristics of movement of the industrial machine, the neural-network being configured to perform automatic classification of the detection signal to determine one or more parts of the electronic or mechanical system having a faulty operation or a failure.

6. The system according to claim 5, wherein the control circuitry is configured to perform a preventive and predictive analysis to predict a faulty operation or a failure of one or more parts of the industrial machine.

7. The system according to claim 5, wherein the stimulation device is configured to generate the vibrations having characteristics detectable by the MEMS sensor.

8. The system according to claim 7, wherein the vibrations have frequencies being in a detection band of the MEMS sensor and distinct from a frequency band in which the industrial machine operates.

9. The system according to claim 1, wherein the MEMS sensor is a movement sensor and the verification sensor is a microphone sensor.

10. The system according to claim 1, wherein the control circuitry is configured to confirm or reject an alarm condition associated with a detection signal generated by the MEMS sensor and indicative of characteristics of movement of the industrial machine, according to the operating state of the MEMS sensor determined based on the diagnostic signal.

11. A method, comprising:
triggering an alarm by a controller in response to a detection signal from a microelectromechanical (MEMS) sensor, the controller and the MEMS sensor both being attached to a printed circuit board attached to a machine;
performing a diagnostic test in response to the alarm by:
generating vibrations in a plurality of frequencies with a stimulation device that is separate and distinct from the MEMS sensor and that is attached to the printed circuit board and electrically coupled to the controller;
generating a verification signal by a verification sensor based on the vibrations, the verification sensor is separate and distinct from the MEMS sensor and the stimulation circuit, the verification sensor being attached to the printed circuit board and electrically coupled to the controller;
determining, with the controller, whether or not the stimulation device is operating properly based on the verification signal;
generating a diagnostic signal by the MEMS sensor based on the vibrations;
comparing, with the controller, the diagnostic signal to a threshold response;
determining, with the controller a malfunction of the MEMS sensor if the stimulation device is functioning properly and the diagnostic signal does not satisfy a threshold response;
determining that the machine is faulty if the stimulation device is operating properly and the diagnostic signal satisfies the threshold response; and
transmitting the malfunction of the MEMS sensor to a management unit of the machine, the management unit being distinct from the printed circuit board.

12. The method according to claim 11, wherein the determining the malfunction of the MEMS sensor includes executing a joint time-frequency analysis of the diagnostic signal and checking for an expected response pattern in the joint time-frequency analysis.

13. The method according to claim 11, comprising conducting automatic classification using a neural network based on the joint time-frequency analysis in order to determine the malfunction of the MEMS sensor.

14. The method according to claim 13, comprising performing operations of conducting automatic classification of a detection signal generated by the MEMS sensor and indicative of characteristics of movement of the machine and determining one or more parts of the machine having a faulty operation or a failure based on the automatic classification.

15. The method according to claim 11, comprising: executing a preliminary verification of the stimulation signal, and consequently of the reliability of the determining the malfunction of the MEMS sensor, based on the verification signal.

16. The method according to claim 11, comprising confirming or rejecting the alarm associated with a detection signal generated by the MEMS sensor and indicative of characteristics of movement of the machine, according to the malfunction of the MEMS sensor determined based on the diagnostic signal.

17. A system, comprising:
a printed circuit board;
a micro-electro-mechanical-system (MEMS) sensor coupled to a first side of the printed circuit board;
a stimulation device coupled to a second side of the printed circuit board, the stimulation device being configured to generate vibrations in a plurality of frequencies to be sensed by the MEMS sensor, the MEMS sensor being external to the stimulation circuitry and configured to generate a diagnostic signal in response to sensing the vibrations;
a verification sensor external to the MEMS sensor, the verification sensor coupled to the first side of the printed circuit board, the verification sensor configured to sense the vibrations and generate a verification signal in response to sensing the vibrations; and
control circuitry coupled to the MEMS sensor, the stimulation device, and the verification sensor, the control circuitry is configured to control the stimulation device to generate the vibrations, to receive the diagnostic signal from the MEMS sensor in response to the vibrations, to receive the verification signal from the verification sensor in response to the vibrations, to verify proper generation of the vibrations based on the verification signal, to determine an operating state of the MEMS sensor by comparing the diagnostic signal to a threshold response, wherein the control circuitry is configured to determine that the operating state corresponds to a malfunction of the MEMS sensor if the stimulation device is functioning properly and the diagnostic signal does not satisfy the threshold response diagnostic signal, and configured to output the operating state and a status of an alarm condition.

18. The system of claim 17, wherein the MEMS sensor is a movement sensor and the verification sensor is a microphone sensor.

19. The system of claim 17, wherein the control circuitry is configured to perform a joint time-frequency analysis of the diagnostic signal and to check for a response pattern in the joint time-frequency analysis.

* * * * *